United States Patent [19]

Toriumi et al.

[11] Patent Number: 5,203,443
[45] Date of Patent: Apr. 20, 1993

[54] CONVEYING APPARATUS USED IN ASSEMBLING SEMICONDUTORS

[75] Inventors: Kiyoshi Toriumi; Kazumasa Kimura, both of Tokyo, Japan

[73] Assignee: Kabushiki Kaisha Shinkawa, Tokyo, Japan

[21] Appl. No.: 841,857

[22] Filed: Feb. 26, 1992

Related U.S. Application Data

[63] Continuation of Ser. No. 611,918, Nov. 9, 1990, abandoned.

[30] Foreign Application Priority Data

Nov. 13, 1989 [JP] Japan .................................. 1-292435

[51] Int. Cl.⁵ ............................................. B65G 43/00
[52] U.S. Cl. .................................. 198/341; 198/396.2; 198/358
[58] Field of Search ................. 198/341, 349.8, 346.2, 198/358, 370

[56] References Cited

U.S. PATENT DOCUMENTS

| | | | |
|---|---|---|---|
| 3,429,416 | 2/1969 | Provost et al. ............... | 198/358 X |
| 4,227,607 | 10/1980 | Malavenda ..................... | 198/460 |
| 4,301,958 | 11/1981 | Hatakenaka et al. ........... | 198/341 X |
| 4,306,646 | 12/1981 | Magni ............................ | 198/346.2 X |
| 4,369,872 | 1/1983 | Sticht ............................ | 198/405.1 X |
| 4,492,297 | 1/1985 | Sticht ............................ | 198/465.1 |
| 4,502,585 | 3/1985 | Sticht ............................ | 198/345.3 |
| 4,530,287 | 7/1985 | Sticht ............................ | 198/465.1 X |
| 4,852,717 | 8/1989 | Ross et al. ..................... | 198/460 X |
| 4,921,092 | 5/1990 | Crawford et al. .............. | 198/460 |

FOREIGN PATENT DOCUMENTS 1-31688 6/1989 Japan .

Primary Examiner—Robert P. Olszewski
Assistant Examiner—Cheryl L. Gastineau
Attorney, Agent, or Firm—Koda and Androlia

[57] ABSTRACT

In a conveying apparatus (used in assembling for example, semiconductors), workpieces are conveyed and distributed to each one of a plurality of processing devices such as bonders via a single conveying line that is made up with a plurality of conveyors provided for each processing device. Sensors are used for checking the workpieces to control the conveyors so that workpieces are avoided from colliding with each other.

3 Claims, 1 Drawing Sheet

CONVEYING APPARATUS USED IN ASSEMBLING SEMICONDUTORS

This is a continuation of application Ser. No. 611,918, filed Nov. 9, 1990, now abandoned.

BACKGROUND OF THE INVENTION

1. Field of the Invention

The present invention relates to a conveying apparatus and more particularly to a conveying apparatus which conveys workpieces used in assembling, for example, semiconductors.

2. Prior Art

Japanese Patent Application Laid-Open (Kokoku) No. 1-31688 discloses one example of an apparatus for conveying, for example, lead frames. In this apparatus, a plurality of processing devices, such as bonders, of the same type are arranged in a row. A single conveying line is provided so that it is used commonly for the processing devices to and from which workpieces are supplied and discharged.

More specifically, in this apparatus, as shown in FIG. 2, a plurality of wire bonders 1A, 1B, 1C and 1D are installed in a row. A main conveyor 2 is installed in front of these wire bonders 1A through 1D, and the conveyer 2 is used commonly for all the bonders. The conveyor 2 is provided along a feed-guiding device 3 and is driven by a motor 4.

As seen in the bonder 1B, each one of the wire bonders 1A through 1D is provided with a supply means 5 which picks up the workpieces from the main conveyor 2, a pitch-feeding means 7 which feeds the workpieces (at a prescribed pitch) to the bonding head section 6, and a discharge means 8 which discharges the finished workpieces onto the main conveyor 2.

The workpieces to be supplied to the bonders are fed to the main conveyor 2 from a supply magazine 9. The workpieces which have been finished by the wire bonders 1A through 1D are discharged to return to the main conveyor 2 and then accommodated in a storage magazine 10.

More specifically, the workpieces from the supply magazine 9 are supplied to one of the wire bonders 1A through 1D (upon request from such a particular bonder) via the supply means 5 of such wire bonder. The workpieces on which wire bonding has been completed by the wire bonder are discharged and returned to the main conveyor 2 by the discharge means 8 and then accommodated in the storage magazine 10.

Thus, the supply and discharge of the workpieces are performed using the main conveyor 2 which is provided to be used commonly to a plurality of wire bonders 1A, 1B . . . .

Accordingly, it is necessary to establish synchronization among the wire bonders 1A through 1D (i.e., the processing devices) so that the discharge operation is performed in a unified manner (i.e., with a multiple number of workpieces being discharged simultaneously) using a prescribed timing which prevents any restriction on the supply of the workpieces. It is otherwise necessary to perform the supply and discharge so that the workpieces are supplied from and discharged onto the main conveyor 2 one workpiece at a time.

Thus, in prior art apparatus described above, it is necessary to establish a supply-discharge synchronization among the processing devices when many workpieces are conveyed by the main conveyor at the same time. As a result, there are limitations to the processing time of each processing device and to the number of devices to be installed. If the workpieces are conveyed by the main conveyor one workpiece at a time, the conveying efficiency of the line drops greatly as the number of processing devices increases.

SUMMARY OF THE INVENTION

Accordingly, the object of the present invention is to provide an apparatus for conveying workpiece such as lead frames, etc. which performs both supply and discharge operations of a multiple number of workpieces without being affected by processing time or the number of processing devices, thus improving the conveying efficiency of the workpiece.

The object of the present invention is accomplished by a unique structure for a conveying apparatus that includes a plurality of processing devices of the same type so that workpieces supplied to and discharged from respective processing devices are conveyed in a common, single conveying line, wherein such a single conveying line is set up with a plurality of conveyors in a manner that each conveyor is controlled individually, and sensors which detect the workpieces are installed for each conveyor.

Since the single conveying line is constructed by a plurality of conveyors, a multiple number of workpieces can be conveyed simultaneously. When it is likely that the workpieces on one conveyor collide with the workpiece on the other conveyor, one of the conveyors is temporarily stopped by controlling respective motors in accordance with signals from the respective sensors.

DETAILED DESCRIPTION OF THE INVENTION

Figure 1:
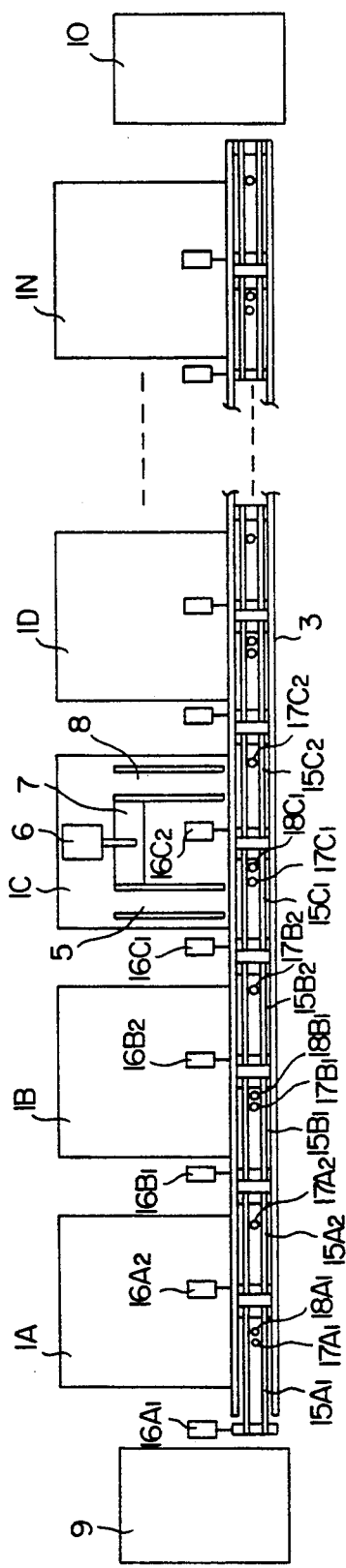
FIG. 1 is a plan view illustrating the structure of the embodiment of the present invention.
Figure 2:
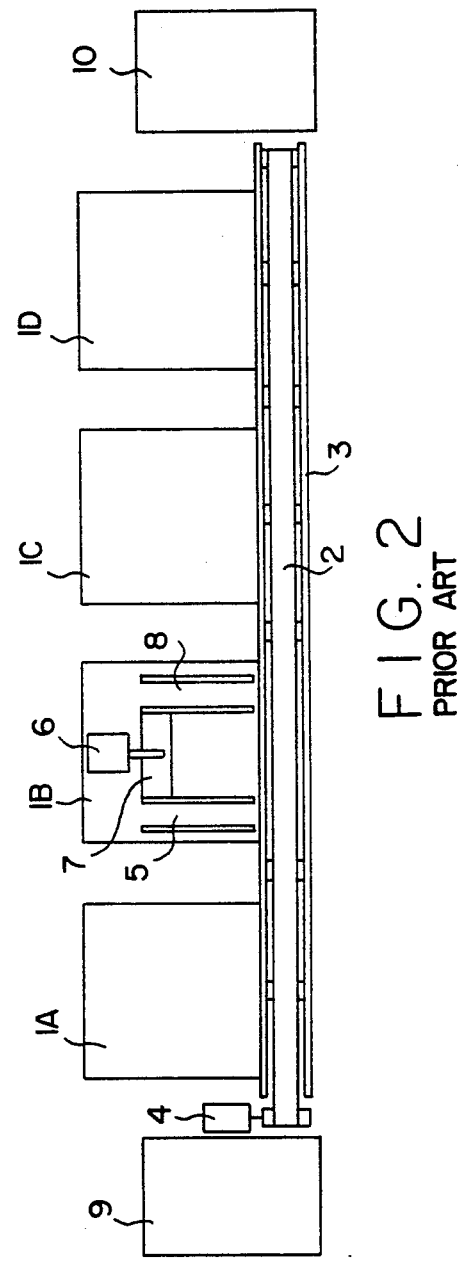
FIG. 2 is a plan view showing conventional apparatus.

One embodiment of the present invention will be described with reference to FIG. 1. Elements which are the same as those in FIG. 2 will be given the same symbols and not described in detail.

Two conveyors $15A_1$ and $15A_2$ are provided for the bonder 1A. Similarly, conveyors $15B_1$ and $15B_2$, $15C_1$ and $15C_2$ and so on are installed for each wire bonder 1B, 1C . . . 1N. These conveyors are provided along the feed-guiding device 3.

The conveyors $15A_1$, $15B_1$ . . . are installed so that workpiece on such conveyors are picked by the supply means 5 of the respective wire bonders 1A, 1B . . . 1N. The conveyors $15A_2$, $15B_2$ . . . are installed so that workpieces are discharged thereon by the discharge means 8 of the respective wire bonders 1A, 1B . . . 1N.

The conveyors $15A_1$ and $15A_2$, $15B_1$ and $15B_2$ . . . are individually driven by motors $16A_1$ and $16A_2$, $16B_1$ and $16B_2$ . . . respectively.

In addition, sensors $17A_1$ and $17A_2$, $17B_1$ and $17B_2$ . . . which detect the passage of the workpieces are installed above the respective conveyors $15A_1$, $15A_2$, $15B_1$, $15B_2$ . . . .

Positioning plates $18A_1$, $18B_1$, . . . which move up and down and position the workpiece are installed in the areas of the conveyors $15A_1$, $15B_1$ . . . which are installed facing the supply devices 5.

Operation of the apparatus of this embodiment will be described below in terms of five (5) different situations.

First, a description will be made for the case in which one of the wire bonders 1A, 1B ... 1N requests the supply of a workpiece thereto (and then performs the bonding) will be described.

When, for example, the wire bonder 1B requests the supply of a workpiece thereto, the conveyor $15B_1$ and the conveyors $15A_1$ and $15A_2$ (which are located closer to the supply magazine 9 than the conveyor $15B_1$) are all driven. In other words, the motors $16A_1$, $16A_2$ and $16B_1$ run so that the conveyors $15A_1$, $15A_2$ and $15B_1$ are all driven.

Accordingly, a workpiece is supplied to the conveyor $15A_1$ from the supply magazine 9, and when the sensor $17A_2$ detects the passage of the workpiece, the positioning plate $18B_1$ projects upward and the workpiece on the conveyor $15B_1$ is positioned. When the sensor $17B_1$ detects the workpiece, the conveyor $15B_1$ stops. The workpiece is then supplied to the wire bonder 1B by the supply means 5 of the wire bonder 1B.

Secondly, a discharge operation, upon request, of workpiece from one of the wire bonders 1A, 1B ... 1N will be described:

When, for example, discharge of a workpiece from the wire bonder 1B is requested (that is, when a workpiece is discharged from the bonder 1B), the conveyor $15B_2$ and the conveyors $15C_1$ and $15C_2$ (which are located closer to the storage magazine 10 than the conveyor $15B_2$) are all driven. As a result, the workpiece is discharged onto the conveyor $15B_2$ from the wire bonder 1B and conveyed by the conveyors $15B_2$, $15C_1$ and $15C_2$, being accommodated in the storage magazine 10.

Third situation is a case in which the supply of workpieces is requested by two or more of the wire bonders either simultaneously or in a successive manner. Description will be made for a case in which the supply of workpieces is requested by the wire bonders 1B and 1C (or workpieces are picked up by bonders 1B and 1C) will be described.

If such a request is initiated by the wire bonder 1C and then followed by the request by the wire bonder 1B, no problems would occur when the workpieces are supplied from the supply magazine 9 to the conveyor $15A_1$ by performing the operation described in the first operation above. Even when both wire bonders 1B and 1C simultaneously request (and pick up) the workpieces, these requests can be handled in the same manner as described above by letting the wire bonder 1C function first.

However, when the supply of workpiece is requested by the wire bonder 1B and then followed by a request by the wire bonder 1C, the following steps will be taken: the workpieces are successively supplied to the conveyor $15A_1$ from the supply magazine 9; the first workpiece is stopped on the conveyor $15B_1$; and then such workpiece is supplied to the wire bonder 1B.

If, however, the next workpiece which is to be supplied to the wire bonder 1C is fed onto the conveyor $15B_1$ before the supply operation for the previous workpiece is completed, the workpieces have a great chance to collide with each other. Accordingly, if the workpiece that is to be supplied to the wire bonder 1B is still on the conveyor $15B_1$, the motor $16A_2$ is stopped when the workpiece that is to be sent to the wire bonder 1C is fed onto the conveyor $15A_2$. Thus, the latter workpiece is caused to stay on the conveyor $15A_2$. Then, after it is confirmed that the workpiece on the conveyor $15B_1$ has been supplied to the wire bonder 1B, the motors $16A_2$, $16B_1$, $16B_2$ and $16C_1$ are started. As a result, the conveyors $15A_2$, $15B_1$, $15B_2$ and $15C_1$ are driven, and from this point on, the first operation is performed.

Fourth situation is that the discharge operation of workpiece from two or more of the wire bonders 1A, 1B ... 1N is requested either simultaneously or in succession. Explanation will be given in connection with a case where the discharge of workpieces from the wire bonders 1B and 1C is requested.

If there is a discharge request originated by the wire bonder 1C followed by discharge request by the wire bonder 1B, the workpieces can be handled successively by the same operation as described in the second situation above without any problems arising. Even when there are discharge requests originated simultaneously by the wire bonders 1B and 1C, simultaneous discharge operations can be performed without any problems.

When there is a discharge request originated by the wire bonder 1B that is followed by a discharge request by the wire bonder 1C, the following operation will be performed:

As far as a workpiece is discharged onto the conveyor $15C_2$ from the wire bonder 1C after the workpiece discharged from the wire bonder 1B has passed the conveyor $15C_2$, there is no problem.

However, if a workpiece is discharged onto the conveyor $15C_2$ from the wire bonder 1C immediately before the workpiece discharged from the wire bonder 1B passes through the conveyor $15C_2$, there is a great chance that the workpieces will collide with each other. In this case, either one of the following two operations will be taken:

(1) The workpiece to be discharged from the wire bonder 1C is discharged from the wire bonder 1C after the workpiece discharged from the wire bonder 1B has passed through the conveyor $15C_2$, or (2) The workpiece to be discharged from the wire bonder 1B is stopped on the conveyor $15C_1$, the workpiece treated by the bonder 1C is discharged onto the conveyor $15C_2$, such a workpiece on the conveyor $15C_2$ is fed out, then the conveyor $15C_1$ is driven.

The fifth situation is a case in which there are both supply and discharge requests originated by the wire bonders 1A, 1B ... 1N. The case in which there are requests originated by the wire bonders 1B and 1C will be described in this regard.

If there is a supply request made by the wire bonder 1B and a discharge request by the wire bonder 1C, there would be no problem. Also, if there are both supply and discharge requests originated by the same wire bonder, for example by the wire bonder 1B, there would be no problems either.

However, if there is a discharge request by the wire bonder 1B and a supply request by the wire bonder 1C, the operations below will be taken:

(1) When the workpiece discharged from the wire bonder 1B is on the conveyor $15B_2$, the workpiece that is to be supplied to the wire bonder 1C is temporarily stopped on the conveyor $15B_1$.

(2) When the workpiece that is to be supplied to the wire bonder 1C is passing through the conveyor $15B_2$, the workpiece from the wire bonder 1B is discharged onto the conveyor $15B_2$ after the workpiece on the conveyor $15B_2$ has passed through the conveyor $15B_2$.

(3) When the workpiece that it to be supplied to the wire bonder 1C is on the conveyor $15C_1$, the workpiece discharged from the wire bonder 1B is temporarily stopped on the conveyor 15B$_2$.

As described above, according to the present invention, (a) A single conveying line, which transfers (i) the workpieces which are supplied to a plurality of wire bonders of the same type and (ii) the workpieces which are discharged from the wire bonders, is made up with a plurality of conveyors;

(b) The conveyors are individually controlled by respective motors;

(c) The workpieces passing through the respective conveyors are detected by respective sensors;

Accordingly, if there is a chance that workpieces on the conveyors collide with each other, such collisions can be avoided by temporarily stopping the conveyors by which such workpieces are being carried. As a result, many workpieces can be simultaneously conveyed by a single conveying line, so that the conveying or transferring efficiency of the conveying line is improved.

In the embodiment described above, the workpieces are supplied to the conveying line from a supply magazine 9. However, it is possible to connect apparatuses that performs preceding process, e.g., die bonders, curing apparatuses, etc. to the conveying line so that the workpieces are directly supplied after the die bonding or curing process.

Moreover, instead of using the storage magazine 10, subsequent-process devices such as molding apparatus, etc. can be connected to the conveying line so that the workpieces are supplied to the molding apparatus, etc. immediately after the wire bonding step by the apparatus of the present invention.

Furthermore, in the above embodiment, two conveyors (i.e., 15A$_1$ and 15A$_2$, 15B$_1$ and 15B$_2$, and so on), are installed for each wire bonder. However, one conveyor or three or more conveyors may be installed for each wire bonder.

In the present invention, as is clear from the above description, the supply and discharge of a multiple number of workpieces can be performed without being affected by the processing time of the processing devices (that is bonders in the embodiment) or the number of processing devices installed. Accordingly, the conveying efficiency can be remarkably improved.

We claim:

1. A conveying apparatus for use in conveying and processing semiconductors comprising a plurality of devices which each perform same semiconductor processing operations arranged in a row and a single conveying line provided so as to be used commonly by said plurality of devices that supplies and discharges semiconductors processed by said devices, said apparatus being characterized in that said single conveying line comprises a plurality of conveyors provided in series, with at least two of said plurality of conveyors provided for each of said plurality of processing devices, a control means is provided for individually controlling each of said plurality of conveyors such that semiconductors are independently supplied and discharged upon independent demand of each of said plurality of devices, and sensors coupled to said control means which detect said semiconductors are installed for each of said conveyors.

2. A control means according to claim 1, further comprising a supply magazine provided at one end of said single conveying line for supplying semiconductors to be processed and a storage magazine provided at another end of said single conveying line for storing semiconductors which have been processed.

3. A conveying apparatus according to claim 1, wherein said control means further controls each of said plurality of conveyors such that there is at most one semiconductor on each of said plurality of conveyors at the same time.

* * * * *